United States Patent
Kanda

(10) Patent No.: US 7,078,354 B2
(45) Date of Patent: Jul. 18, 2006

(54) METHOD OF MANUFACTURING SEMICONDUCTOR DEVICE HAVING OXIDE FILMS WITH DIFFERENT THICKNESS

(75) Inventor: Takayuki Kanda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/843,694

(22) Filed: May 12, 2004

(65) Prior Publication Data

US 2005/0003618 A1 Jan. 6, 2005

(30) Foreign Application Priority Data

May 13, 2003 (JP) ............................. 2003-134265

(51) Int. Cl.
*H01L 21/31* (2006.01)
(52) U.S. Cl. .................. 438/770; 438/763; 438/773; 438/775; 438/778; 438/787; 438/791; 257/632; 257/760; 257/E33.06; 257/E31.119
(58) Field of Classification Search ................ 438/513, 438/694, 710, 723, 761, 763, 769, 770, 775, 438/778, 787, 788, 791, 792, 798, FOR. 395, 438/FOR. 397, FOR. 403, 773; 257/333, 257/632, 760, E33.06, E31.119
See application file for complete search history.

(56) References Cited

U.S. PATENT DOCUMENTS

| 6,746,965 B1* | 6/2004 | Uehara et al. ............... 438/713 |
| 6,756,635 B1 | 6/2004 | Yasuda et al. |
| 6,759,302 B1* | 7/2004 | Chen et al. ................. 438/275 |
| 2004/0092133 A1* | 5/2004 | Hyun et al. ................. 438/787 |

FOREIGN PATENT DOCUMENTS

| JP | 2000-216257 | 8/2000 |
| JP | 2001-53242 | 2/2001 |

OTHER PUBLICATIONS

Taiwanese Office Action dated Aug. 16, 2005 (with partial English translation).

* cited by examiner

*Primary Examiner*—George Fourson
*Assistant Examiner*—Joannie Adelle Garcia
(74) *Attorney, Agent, or Firm*—McGinn IP Law Group, PLLC

(57) ABSTRACT

After a first gate oxide film (302) is formed on a substrate (301), a nitride layer (303) is formed by a first oxynitriding process. The first gate oxide film is selectively removed from a thinner film part area of the substrate. A second gate oxide film forming process forms a second gate oxide film (305A) in the thinner film part area and a third gate oxide film (305B) in a thicker film part area. By executing second oxynitriding process, nitride layers (306A and 306B) are formed at the thinner and the thicker part areas.

17 Claims, 7 Drawing Sheets

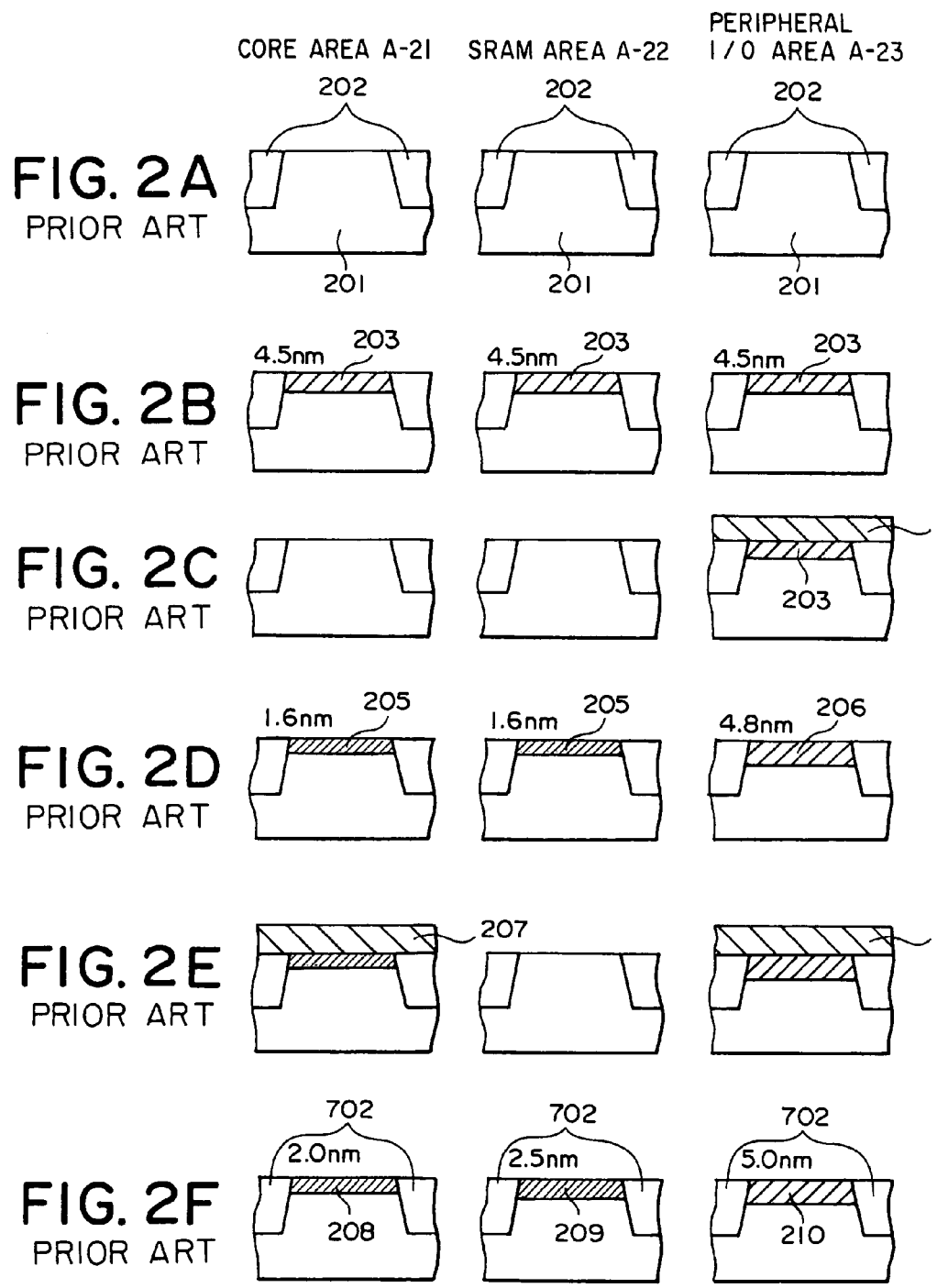

METHOD OF MANUFACTURING SEMICONDUCTOR DEVICE HAVING OXIDE FILMS WITH DIFFERENT THICKNESS

This application claims priority to prior Japanese Application JP 2003-134265, the disclosure of which is incorporated herein by reference.

BACK GROUND OF THE INVENTION

This invention relates to a method of manufacturing a semiconductor device, in particular, to a manufacturing method of a semiconductor device including transistors having gate insulating films with different thickness.

There is a known semiconductor device, which plural kinds of transistors having gate insulating films with different thickness are formed on a common substrate as a combination of a semiconductor memory and peripheral circuits thereof is done so.

A conventional method of manufacturing the semiconductor device of the type uses an oxynitriding process for a thinner gate insulating film for one of the transistors. That is, nitrogen elements are mainly introduced into the thinner gate insulating film. No or few nitrogen elements are introduced into a thicker gate insulating film for another one of the transistors.

Generally, when thickness of a gate oxide film is 7 nm or more as before, the oxynitriding process is unnecessary. This is because the thicker gate oxide film equal to or more than 7 nm has no problem such as leakage current and boron leakage. Moreover, the oxynitriding process is undesirable when the thickness of the gate oxide film is 5 nm or more because it deteriorates reliability of the gate oxide film.

However, the gate oxide film of the transistor tends to become thin according to demands of miniaturizing, implementing thin design, and saving power consumption of the semiconductor device recently. Thus, importance of the oxynitriding process becomes high to suppress leakage current and to improve operating characteristics of the transistor. Therefore, in a case of manufacturing the semiconductor device including plural kinds of transistors having gate insulating films with different thickness, it becomes important to introduce nitrogen elements into not only the thinner gate insulating film but also the thicker gate insulating film.

SUMMARY OF THE INVENTION

It is therefore an object of this invention to provide a method of manufacturing a semiconductor device capable of introducing nitrogen elements into not only a thinner gate insulating film formed on a substrate but also a thicker gate insulating film formed on the substrate.

Other object of this invention will become clear as the description proceeds.

According to an aspect of this invention, a method of manufacturing semiconductor device includes multi-oxidation process for forming oxide films with different thickness on a substrate. The method comprising the steps of executing an oxide film forming process for forming each of said oxide films on said substrate, and inevitably executing an oxynitriding process for forming nitride layer in each of said oxide films after the oxide film forming process.

According to another aspect of this invention, a semiconductor device has a substrate with a plurality of regions. The semiconductor device comprises oxide films which are formed in the regions and which have different thickness. Nitride layers is formed at vicinities of interfaces between the oxide films and the substrate.

BRIEF DESCRIPTION OF THE DRAWING

FIGS. 2A–2F are schematic sectional views for describing another method of manufacturing another related semiconductor device including transistors having gate insulating film with different thickness;

DESCRIPTION OF THE PREFERRED EMBODIMENTS

Referring to FIGS. 1A to 1F, description will be at first directed to a method of manufacturing a related semiconductor device including transistors having gate insulating films with different thickness. Such a process is disclosed in Unexamined Japanese Patent Publication No. 2000-216257.

Figure 1A:
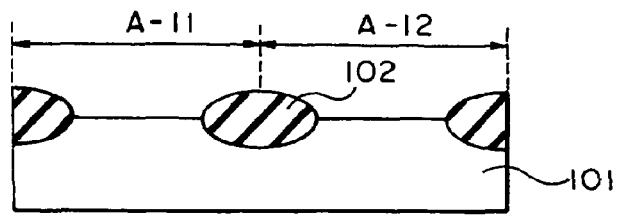
FIGS. 1A–1F are schematic sectional views for describing a method of manufacturing a related semiconductor device including transistors having gate insulating films with different thickness.

At first, as illustrated in FIG. 1A, a silicon substrate 101 is provided and LOCOS (Local Oxidation of Silicon) oxide film 102 are formed in the silicon substrate 101. The LOCOS oxide film 102 define device forming areas including higher and lower voltage system transistor forming areas A-11 and A-12 and isolate them from each other.

Figure 1B:
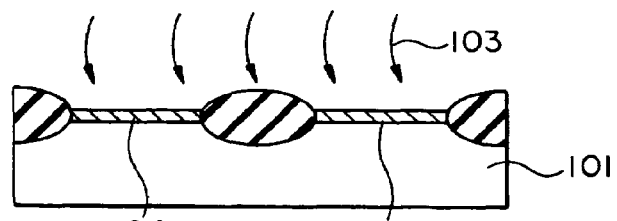

Next, as shown in FIG. 1B, a first heat-treating process is executed to the silicon substrate 101 in atmosphere of oxidation seeds 103. The first heat-treating process oxidizes exposed surfaces of the silicon substrate 101 and thereby silicon oxide films 104 are formed on/in the silicon substrate 101.

Figure 1C:
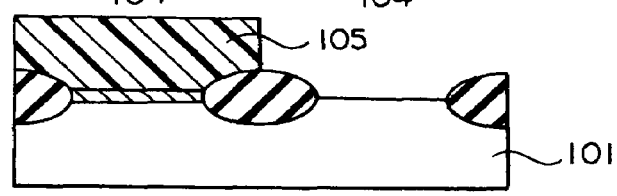

Next, as shown in FIG. 1C, after a resist film 105 is formed at the higher voltage system transistor forming area A-11, the silicon oxide film 104 of the lower voltage system transistor forming area A-12 is removed by a wet etching process to expose the silicon substrate 101. Then the resist 105 is completely removed from the higher voltage system transistor forming area A-11.

Figure 1D:
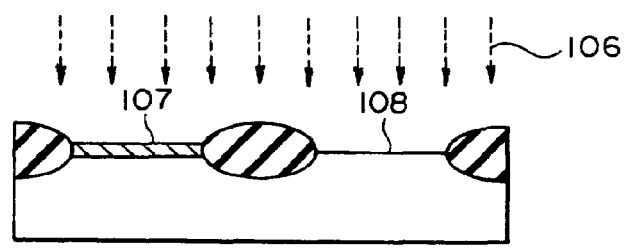

Subsequently, as shown in FIG. 1D, nitrogen ions 106 are implanted in the areas A-11 and A-12 by an ion implanter (not shown). As a result, an azotized silicon oxide film 107 is formed at the higher voltage system transistor forming area A-11 while a silicon nitride film 108 is formed at the lower voltage system transistor forming area A-12.

Figure 1E:
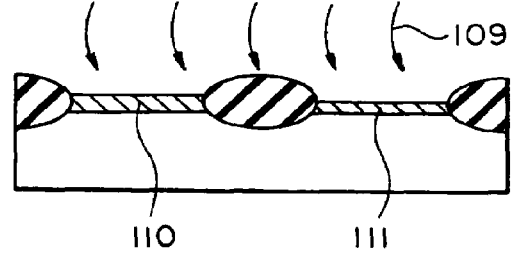

Next, as shown in FIG. 1E, a second heat-treating process is made to the silicon substrate 101 in atmosphere of oxidation seeds 109 and thereby a thicker gate oxide film 110 and a thinner gate oxide film 111 are formed at the areas A-11 and A-12, respectively.

Figure 1F:
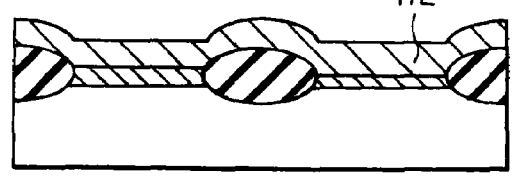

Lastly, as shown in FIG. 1F, a polysilicon film 112 is deposited on the upper exposed surface of the silicon substrate 101 with the thicker gate oxide film 110 and the thinner gate oxide film 111.

After that, the polysilicon film 112 is patterned in predetermined pattern. Then, gate electrodes and source-drain regions are formed on/in the semiconductor substrate 101 to form the semiconductor device. Thus, the semiconductor device including two (or more) kinds of transistors with different thickness of gate insulating film is completed.

Another method of manufacturing another related semiconductor device of the type is described in reference to FIGS. 2A–2F. Such a method is disclosed in Unexamined Japanese Patent Publication No. 2001-53242.

At first, as shown in FIG. 2A, a silicon substrate 201 is provided and device isolation layers 202 are formed in the substrate 201 by a trench isolation method. The device isolation layers 202 define device areas A-21, A-22 and A-23. The device areas A-21, A-22 and A-23 are used for a core area, a SRAM area and a peripheral I/O area, respectively. Furthermore, necessary preprocessing such as ion implantation is performed to the silicon substrate 201 with the device isolation layers 202.

Next, as shown in FIG. 2B, oxide films 203 are formed at the device areas A-21, A-22 and A-23 by means of a thermal oxidation method using oxygen gas supplied on the silicon substrate 201. Each of the oxide films 203 has thickness, for example, of 4.5 nm.

As shown in FIG. 2C, after only the peripheral I/O area A-23 and vicinity is covered by a resist film 204, the oxide films 203 of the core area A-21 and the SRAM area A-22 are removed by etching. Then the resist 204 is completely removed from the peripheral I/O are A-23 and the vicinity.

Next, first oxynitriding process is performed to form oxynitride films 205 at the device areas A-21 and A-22. In this event a two-layer film 206 consist of the oxide film and an oxynitride film is formed at the device area A-23. Each of the oxynitride films 205 has a thickness, for example, of 1.6 nm while the two-layer film 206 has a thickness, for example, of 4.8 nm.

Next, as shown in FIG. 2E, after the device areas A-21 and A-23 are covered by resist films 207, the oxynitride film 205 of the device area A-22 is removed by etching. Then the resist films 207 are completely removed from the device areas A-21 and A-23.

After that, second oxynitriding process is performed to the silicon substrate 201 with the oxynitride film 205 at the device area A-21 and the two-layer film 206 at the device area A-23. The second oxynitriding process uses source gas whose density of nitrogen is lower than that of the source gas used in the first oxynitriding process. Accordingly, as shown in FIG. 2F, an oxynitride film 208, an oxynitride film 209 having nitrogen density lower than that of the oxynitride film 208, and a two layer film 210 are formed at the core area A-21, the SRAM area A-22, and the peripheral I/O area A-23, respectively. For example, the films 208, 209 and 210 have thickness of 2.0 nm, 2.5 nm and 5.0 nm, respectively. The films 208, 209 and 210 are used for gate insulating films of transistors.

In the former of the related methods mentioned above, the oxynitride process (e.g. nitrogen ion implantation) is performed only after the first gate oxide film (104) is formed. Moreover, in the latter of the related methods, the oxynitride processes are used for forming the second and third gate insulating films (208 and 209). At any rate, the oxynitride process(es) is (are) used to introduce nitrogen into the thinner (oxide) film part area(s). Accordingly, the related methods can insufficiently introduce nitrogen into the thicker (oxide) film part area. In addition, each of the related methods can not form a nitride layer in the vicinity of interface between the substrate and the gate insulating film. This makes difficult to obtain desirable characteristics of the semiconductor device manufactured by the method.

Referring to FIGS. 3A–3F, the description will proceed to a method of manufacturing a semiconductor device according to a first embodiment of this invention.

In each of FIGS. 3A–3F, the left hand side shows a thinner film part area A-31 (or a low voltage transistor forming area) while the right hand side shows a thicker film part area A-32 (or a high voltage transistor forming area). Though the thinner film part area A-31 must be isolated from the thicker film part area A-32 by a device insolating region, the device isolating region has no relation with this invention and illustrating thereof is omitted in the present specification and drawings. Other parts, such as gate, source and drain regions, having no relation to this invention are also omitted in the present specification and drawings.

Hereafter, the description will be mainly directed to forming gate oxide films and oxynitriding the gate oxide films. Known processes can be used for other necessary processes in the method of manufacturing the semiconductor device.

Figure 3A:
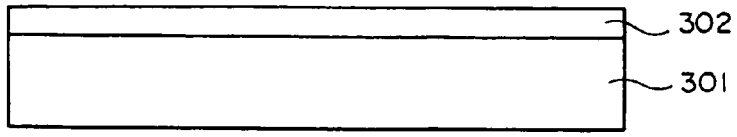
FIGS. 3A–3F are schematic sectional views for describing a method of manufacturing a semiconductor device according to a first embodiment of this invention.

As illustrated in FIG. 3A, at first, a semiconductor substrate (e.g. Si substrate) 301 is provided and a first gate oxide film 302 is formed by a first oxide film forming process on the surface of the semiconductor substrate 301. For the first gate oxide film forming process, various processes may be used. For instance, there are a wet, dry or halogen oxidation using a vertical diffusion equipment, an RTO (Rapid Thermal Oxidation), ISSG (In-Situ Steam Generation) or WVG (Water Vapor Generation) using a sheet fed equipment, and a plasma oxidation with a plasma treatment equipment.

Figure 3B:
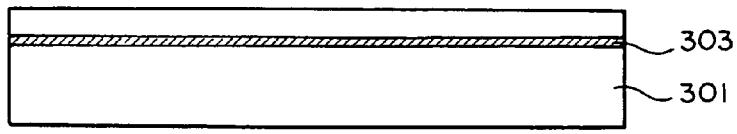

Next, a first oxynitriding process is applied to the semiconductor substrate 301 on which the first gate oxide film 302 is formed. As a result, a first nitride layer 303 is formed in the first gate oxide film 302 as illustrated in FIG. 3B. To execute the oxynitriding process, an NO (nitric oxide), $N_2O$ (nitrous oxide) or $NH_3$ (ammonia) treatment using the vertical diffusion equipment or a sheet fed equipment, or a plasma nitriding using the plasma treatment equipment can be used, for example.

Here, the NO or $N_2O$ treatment tends to form the first nitride layer 303 at vicinity of an interface between the first gate oxide film 302 and the semiconductor substrate 301. Moreover, the $NH_3$ treatment tends to form the first nitride layer 303 both at vicinity of an upper surface of the first gate oxide film 302 and at the vicinity of the interface between the first gate oxide film 302 and the semiconductor substrate 301. Furthermore, the plasma nitriding tends to form the first nitride layer 303 at the vicinity of the upper surface of the first gate oxide film 302.

Figure 3C:
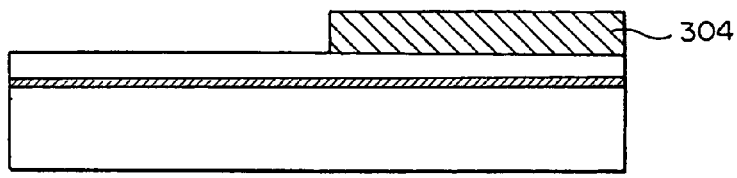

Next, a resist film for an etching mask is deposited on the upper surface of the first gate oxide film 302. Then the resist film is selectively removed from the thinner film part area A-31 by etching to leave the part thereof at the thicker film part area A-32 as illustrated in FIG. 3C. That is, the remaining part of the resist film forms the etching mask 304 at the thicker film part area A-32.

Figure 3D:
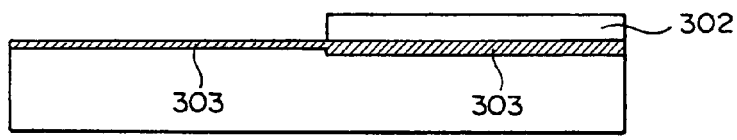

Next, the first gate oxide film 302 of the thinner film part area A-31 is removed by means of a wet etching method using diluted or buffered hydrofluoric acid or a dry etching method. In this event, the first nitride layer 303 of the thinner film part area A-31 is partly removed together with the first gate oxide film 302. As a result, the first nitride layer 303 is divided into a second nitride layer 303A of the thinner film part area A-31 and a third nitride layer 303B of the thicker film part area A-32. Then, the etching mask 304 is completely removed to expose the first oxide film 302 of the thicker film part area A-32 as illustrated in FIG. 3D.

Figure 3E:
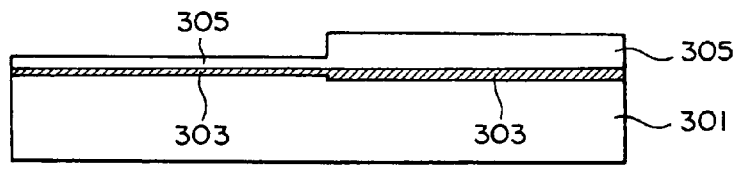

Subsequently, a second oxide film forming process which may be similar to or different from the first oxide film forming process is executed to the semiconductor substrate 301 of FIG. 3D. As a result, as shown in FIG. 3E, a second gate oxide film 305A is formed on the second nitride layer 303A of the thinner film part area A-31. At the same time, a third gate oxide film 305B (including the first oxide film 302) is formed at the thicker film part area A-32.

Figure 4:
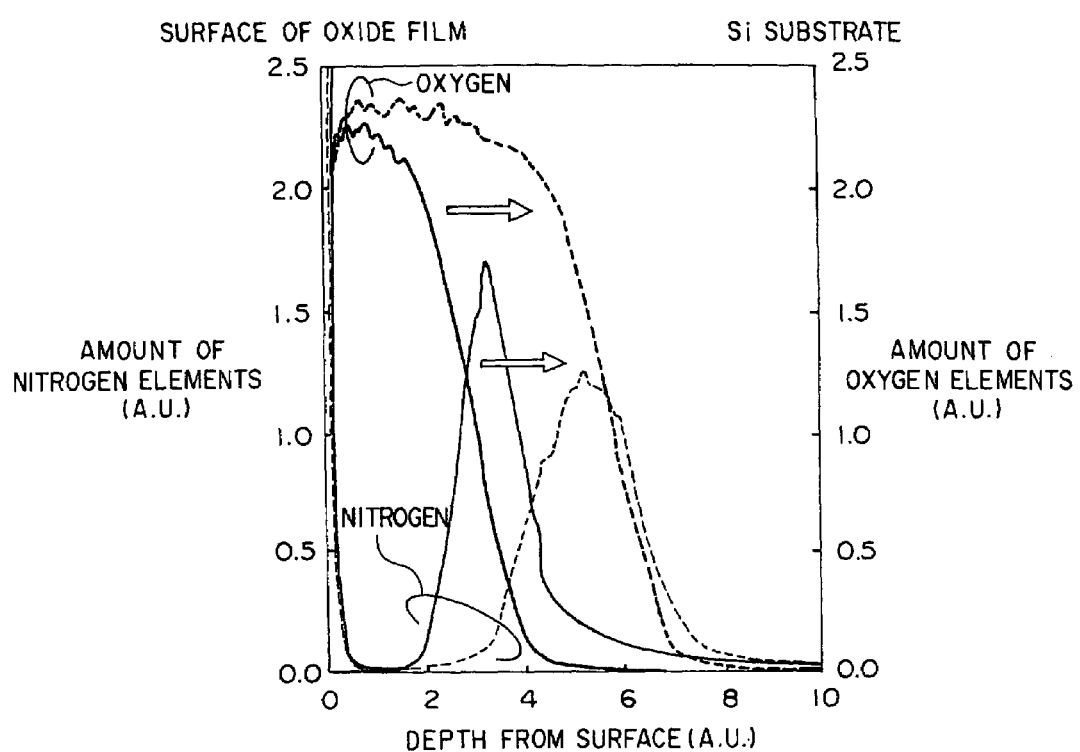
FIG. 4 shows oxygen and nitrogen profiles before and after a second oxide film forming process using ISSG or plasma oxidation.

Here, the third nitride layer 303B (which is maldistributed at the vicinity of interface between the substrate 301 and the third gate oxide film 305B) migrates to the inner part of the third gate oxide film 305B according as the third gate oxide film 305B increases the thickness thereof when the above mentioned oxide film forming methods are used for the second oxide film forming process except the ISSG and the plasma oxidation. To the contrary, when the ISSG or the plasma oxidation is used for the second oxide film forming process, the third nitride layer 303B remains at the vicinity of interface between the substrate 301 and the third gate oxide film 305B as shown in FIG. 4 regardless of increase of the thickness of the third gate oxide film 305B (and/or 302). This is because the ISSG and the plasma oxidation are strong oxidizing methods and cause the oxidative reaction even in the nitride film. By each of the ISSG and the plasma oxidation, the oxidative reaction is advanced at a surface side of the nitride layer previous to at an interface side between the oxide film and the substrate. Thus, the ISSG and the plasma oxidation can execute additional oxidative reaction without losing shape of a nitride profile of a sample having a nitride layer at vicinity of interface between an oxide film and a substrate. In other words, the ISSG and the plasma oxidation can substantially keep the nitride profile formed by previous process(es). Therefore, the ISSG and the plasma oxidation are very useful for a manufacturing process of a semiconductor device whose electronic characteristics of the vicinity of the interface between the oxide film and the substrate are important.

Figure 3F:
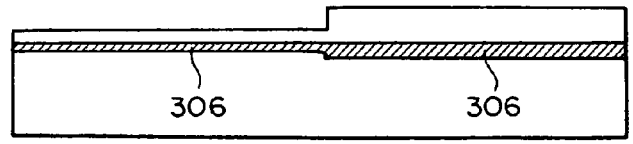

Next, a second oxynitriding process, which may be similar to or different from the first oxynitriding process, is performed to the semiconductor substrate 301 with the second and the third gate oxide film 305A and 305B. Hereby, as shown in FIG. 3F, fourth and fifth nitride layers 306A and 306B are formed at the thinner and thicker film part areas A-31 and A-32, respectively. An amount of nitrogen elements and distribution profile in each nitride layer (306A, 306B) depends on the etching process for partially (selectively) etching the first gate oxide film 302, thickness of the gate oxide film (305A, 305B), treatment condition of the second oxynitriding process and so on.

Figure 5:
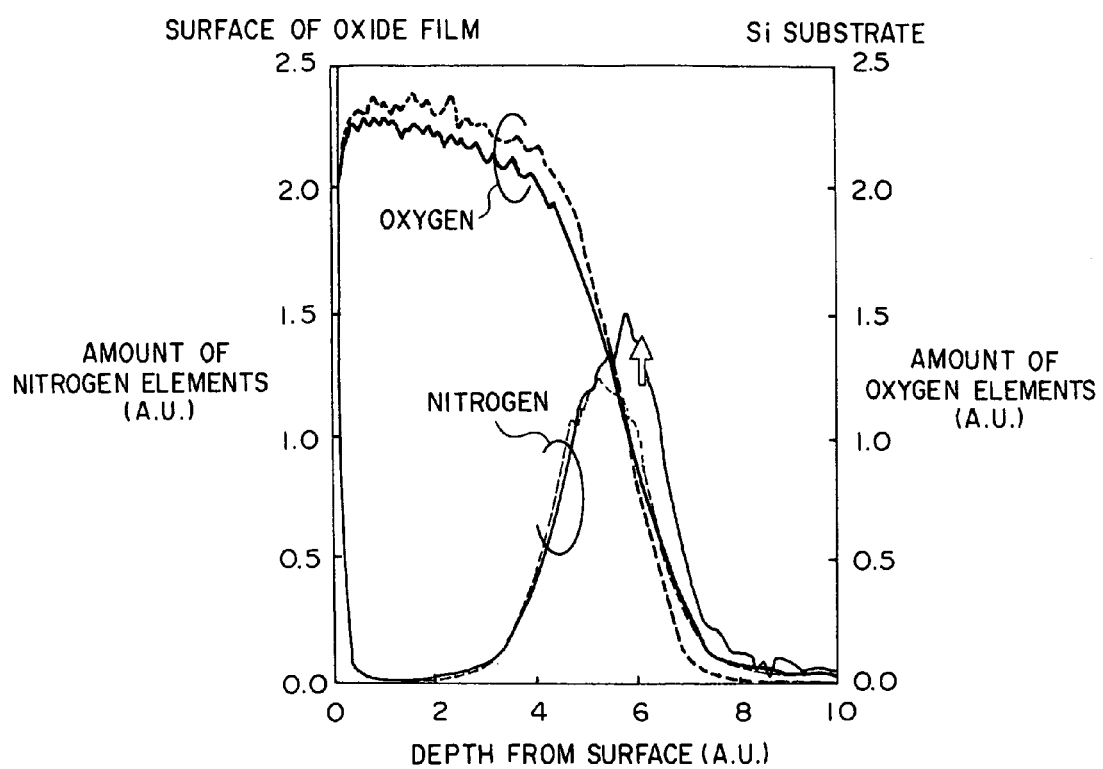
FIG. 5 shows oxygen and nitrogen profiles before and after a second oxynitriding process.

FIG. 5 shows an example of changing oxide and nitride profiles in the NO treatment as the second oxynitriding process. As understood from FIG. 5, the amount of nitrogen in the nitride layer can be increased with hardly changing the position of the nitride layer. This means that it is possible to replenish new nitrogen elements by the second oxynitriding process when the nitrogen elements doped by the first oxynitriding process are missed by the second oxide film forming process.

According to this embodiment, the oxide films (305A and 305B) having different thickness can be formed in the thinner and the thicker film part area A-31 and A-32 respectively, while the nitride films (306A and 306B) having enough nitrogen elements can be formed in the thinner and the thicker film part areas A-31 and A-32, respectively.

For instance, nitrogen density of 3–5% can be introduced into the vicinity of the interface between the oxide film and the semiconductor substrate in both of the thinner and the thicker film part areas A-31 and A-32, if the first NO (nitric oxide) treatment using NO (2L) of 100% is executed for about 30 seconds at 1050° C. with the sheet-fed equipment after the oxide film of thickness 5.0 nm is formed as the first gate oxide film, and the second NO treatment using NO (2L) of 100% is executed for about 30 seconds at 1050° C. with the sheet-fed equipment after the oxide film of thickness 3.0 nm is formed as the second gate oxide film.

Generally, if the thickness of the oxide film is equal to or less than 5 nm, it is not considerable problem that the reliability of the oxidation film is decreased by the introduction of nitrogen. Moreover, because the oxide film forming methods described above can form the oxide film with high reliability, it is hard that introduce of the nitrogen decreases the reliability of the oxide film formed by those methods.

According to the embodiment, the amount of nitrogen element introduced into the thinner film part area A-31 and the thicker film part area A-32 can be independently controlled. For instance, to introduce nitrogen into the thicker film part area A-32 chiefly, the amount of the introduction of nitrogen by the second oxynitriding process only has to be decreased. Oppositely, to introduce nitrogen into the thinner film part area A-31 chiefly, the amount of the introduction of nitrogen by the first oxynitriding process only has to be decreased. Additionally, the amount of the introduction of nitrogen is controlled by changing treatment time of the oxynitoriding process, gas pressure, and/or treatment temperature.

As mentioned above, because the amounts of the nitrogen elements in the nitride layers formed in the thinner and the thicker film part areas can be adjusted in the method of this embodiment, prevention of missing B (boron) and reduction of current leakage in the thinner film part area A-31 and improvement of characteristic regarding interface between the oxide film and the substrate in the thicker film part area A-32 can be both achieved.

Referring to FIGS. 6A to 6E, the description will be made about a second embodiment of this invention. In each of FIGS. 6A to 6E, first, second and third device areas A-61, A-62 and A-63 are arranged from the left side to the right side.

Figure 6A:
FIGS. 6A–6E are schematic sectional views for describing a method of manufacturing a semiconductor device according to a second embodiment of this invention.

At first, like the first embodiment, the first oxide film forming process and the first oxynitriding process are executed to a semiconductor substrate 601. As a result, as shown in FIG. 6A, a first gate oxide film 602 is formed on the semiconductor substrate 601 while a first nitride layer 603 is formed in the first gate oxide film 602.

Figure 6B:
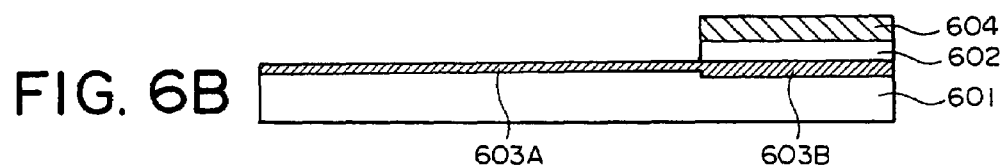

Next, a first resist mask 604 is formed by means of the known method on the third device area A-63. By the use of the first resist mask 604, the first gate oxide film 602 of the first and the second device areas A-61 and A-62 is etched as shown in FIG. 6B. At this time, the first nitride layer 603 is divided into a second nitride layer 603A at the first and the second device areas A-61 and A-62 and a third nitride layer 603B at the third device area A-63.

Figure 6C:
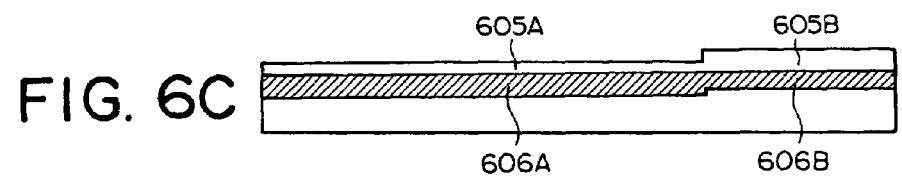

After the first resist mask 604 is removed from the third device area A-63, the second oxide film forming process and the second oxynitriding process are executed to form a second gate oxide film 605A and a fourth nitride layer 606A at the first and the second device areas A-61 and A-62 and a third gate oxide film 605B and a fifth nitride layer 606B at the third device area A-63 as shown in FIG. 6C.

Figure 6D:
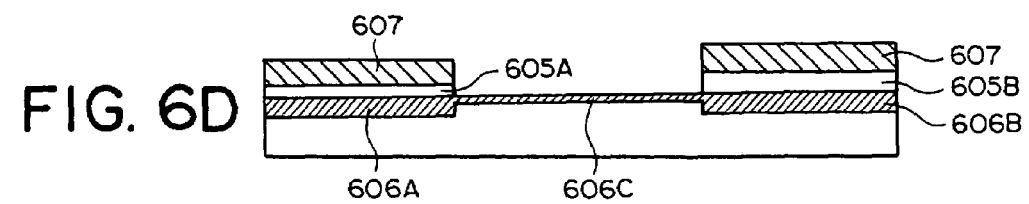

Next, a second resist mask(s) 607 is formed at the first and the third device area A-63. The second oxide film 605A of the second device area A-62 is etched by the use of the resist mask 607. Then, the fourth nitride layer 606A of the second device area A-62 is changed into a sixth nitride film 606C as shown in FIG. 6D.

Figure 6E:
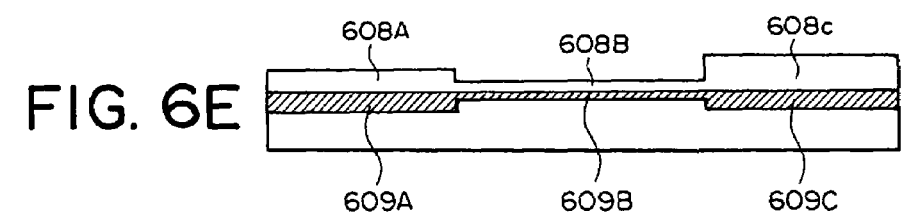

After the resist mask 707 is removed from the first and the third device areas A-61 and A-63, the third oxide film forming process and the third oxynitriding process are executed. Consequently, as shown in FIG. 6E, first, second and third gate oxide films 608A, 608B, and 608C are formed in the first, the second and the third device areas A-61, A-62 and A-63 respectively. Furthermore, first, second and third final nitride layers 609A, 609B and 609C are formed in the first, the second and the third device areas A-61, A-62 and A-63 respectively.

As mentioned above, according to this embodiment, three gate oxide films different from one another in thickness can be formed. Furthermore, the final nitride layers different from one another in amount of doped nitrogen elements can be formed in the interfaces between the gate oxide films and the substrate. In other words, according to the embodiment, it is possible to make three elemental devices, such as transistors, having different (gate) oxide films in thickness and different amounts of nitrogen elements in the nitride layers at the first, the second and the third device areas of the common substrate.

Additionally, the methods used in the first embodiment can be used for the oxide film forming process, the oxynitriding process and the etching process of the second embodiment.

This invention is used for manufacturing four or more elements having different gate oxide films in thickness on a common substrate.

Though the explanation is made for manufacturing the three elemental devices different from one another in thickness of the oxide film on the substrate, this invention can be used for manufacturing four or more elemental devices different from one another in thickness of the gate oxide film on a substrate.

Referring to FIGS. 7A to 7F, the description will be made about a method of manufacturing a semiconductor device according to third embodiment. FIGS. 7A to 7F are different from FIGS. 3A to 3F in arrangement of device area. In each of FIGS. 7A to 7F, a right hand side shows a thinner film part areas A-71 while a left hand side shows a thicker film part area A-72.

Figure 7A:
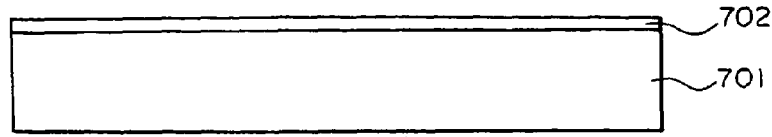
FIGS. 7A–7F are schematic sectional views for describing a method of manufacturing a semiconductor device according to a third embodiment of this invention.

At first, as shown in FIG. 7A, a semiconductor substrate 701 is provided and dealt with a first oxide film forming process to form a first gate oxide film 702.

Figure 7B:
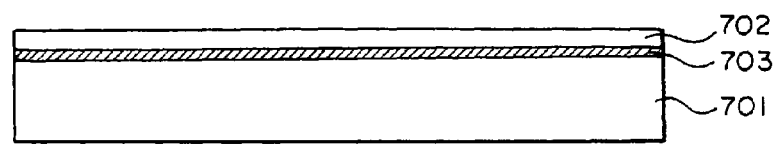

Next, a first oxynitriding process is executed to the semiconductor substrate 701 with the first gate oxide film 702 to form a first nitride layer 703 in the vicinity of an interface between the semiconductor 701 and the first gate oxide film 702 as shown in FIG. 7B. The first nitride layer 703 is formed so that a lot of nitrogen elements are doped compared with the case of the first embodiment.

Figure 7C:
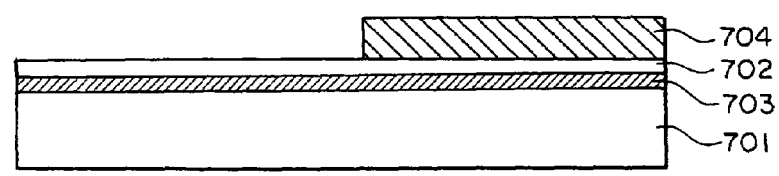
Figure 7D:
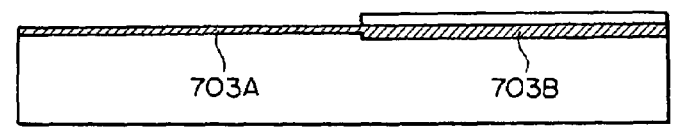

After an etching resist mask 704 is formed in the thinner film part area A-71 as illustrated in FIG. 7C, the first oxide film 702 of the thicker film part area A-72 is selectively removed as shown in FIG. 7D. In this event, the first nitride layer 703 is divided into second and third nitride layers 703A and 703B. Then, the resist mask 704 is completely removed from the thinner film part area A-71.

Figure 7E:
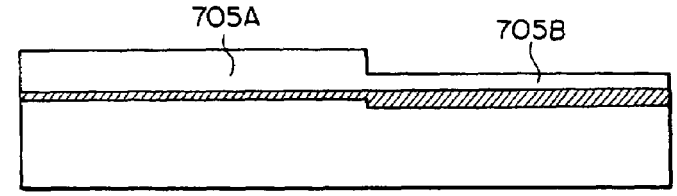

Next a second oxide film forming process is executed to a second gate oxide film 705A as shown in FIG. 7E. In this event, the first oxide film 702 of the thinner film part area A-71 is changed into a third oxide film 705B. The third oxide film 705B is slightly thicker than the first oxide film 702 and thinner than the second gate oxide film 705A. This is because introduction of a large amount of the nitrogen elements reduces an oxidation rate of the semiconductor substrate 701.

Figure 7F:
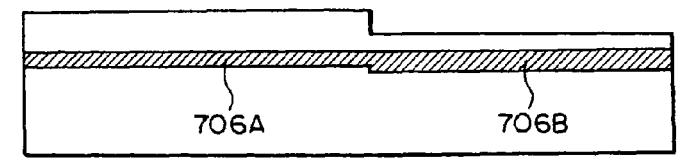

After that, execution of a second oxynitiziding process forms fourth and fifth nitride layers 706A and 706B in the thicker and the thinner film part areas A-72 and A-71, respectively, as shown in FIG. 7F.

As mentioned above, according to the embodiment, the oxide films with different thickness can be formed at the thinner and the thicker part areas of the semiconductor substrate. Furthermore, the nitride layers with sufficient nitrogen elements can be formed by the embodiment. In addition, a single layer film formed by the second gate oxide film forming process and the subsequent oxynitriding process can be assigned to the thicker film part area which needs high reliability in its oxide film while a double layer film formed by two oxide film forming processes can be assigned to the thinner film part area which needs prevention of boron leakage and reduction of current leakage rather than the high reliability in its oxide film.

The method according to this embodiment can use for manufacturing three or more elements with different gate oxide films in thickness on a common substrate.

While this invention has thus far been described in conjunction with the preferred embodiments thereof, it will readily be possible for those skilled in the art to put this invention into practice in various other manners.

What is claimed is:

1. A method of manufacturing a semiconductor device, including a multi-oxidation process for forming oxide films with different thicknesses on a substrate, said method comprising:

executing a plurality of oxide film forming processes for forming said oxide films on said substrate; and executing a plurality of oxynitriding processes for forming a nitride layer in said oxide films after the oxide film forming processes.

2. A method of manufacturing a semiconductor device as claimed in claim 1, wherein the oxide film forming process comprises at least one of:

wet oxidization, dry oxidization and halogen oxidization using a vertical diffusion equipment;

one of rapid thermal oxidation (RTO), in-situ steam generation (ISSG) and water vapor generation (WVG) using a sheet-fed treatment equipment; and plasma oxidization using a plasma treatment equipment.

3. A method of manufacturing a semiconductor device as claimed in claim 1, wherein the oxynitriding processes comprise at least one of:

a NO treatment, a $N_2O$ treatment and a $NH_3$ treatment using a vertical diffusion equipment;

one of a NO treatment, a $N_2O$ treatment and a $NH_3$ treatment using a sheet-fed treatment equipment; and plasma nitridation using a plasma treatment equipment.

4. A method of manufacturing a semiconductor device as claimed in claim 1, wherein a treatment time, gas pressure and treatment temperature in the oxynitriding processes are decided according to an amount of nitrogen elements which should be introduced in each of said oxide films.

5. A method of manufacturing a semiconductor device as claimed in claim 1, wherein on and after a second of said plurality of oxide film forming processes, one of ISSG using a sheet-fed treatment equipment and a plasma oxidation using a plasma treatment equipment is used to substantially keep a nitrogen profile formed in a previous oxynitriding process.

6. A method of manufacturing a semiconductor device as claimed in claim 1, further comprises:
  selectively etching a region of the oxide film, which is formed by a last oxide film forming process, between a last oxynitriding process and a succeeding oxide film forming process.

7. A method of manufacturing a semiconductor device as claimed in claim 1, wherein each of said plurality of oxynitriding processes comprises using a different amount of nitrogen elements.

8. A method of manufacturing a semiconductor device as claimed in claim 1, wherein said plurality of oxide film forming processes comprises forming a plurality of oxide films adjacent to one another on said substrate.

9. A method of manufacturing a semiconductor device as claimed in claim 8, wherein one of said plurality of oxynitriding processes is executed after each of said plurality of oxide film forming processes.

10. A method of manufacturing a semiconductor device as claimed in claim 1, wherein said nitride layer is formed at a vicinity of an interface between a first gate oxide film and said substrate.

11. A method of manufacturing a semiconductor device as claimed in claim 1, wherein said nitride layer is formed at a vicinity of an upper surface of a first gate oxide film.

12. A method of manufacturing a semiconductor device as claimed in claim 1, further comprising:
  controlling an amount of nitrogen element introduced into said oxide films by changing an amount of nitrogen element included in said plurality of oxynitriding processes.

13. A semiconductor device having a substrate with a plurality of regions, comprising:
  oxide films formed in said regions and having different thicknesses; and
  a plurality of nitride layers formed at vicinities of interfaces between said oxide films and said substrate.

14. A semiconductor device as claimed in claim 13, wherein said nitride layers are different from one another in an amount of nitrogen elements.

15. A method of manufacturing a semiconductor device, including a multi-oxidation process for forming oxide films with different thicknesses on a substrate, said method comprising:
  executing an oxide film forming process for forming said oxide films on said substrate; and
  executing a plurality of oxynitriding processes for forming a nitride layer in said oxide films after the oxide film forming process,
  wherein on and after a second oxide film forming process, in-situ steam generation (ISSG) using at least one of a sheet-fed treatment equipment and a plasma oxidation using a plasma treatment equipment is used to substantially keep a nitrogen profile formed a previous oxynitriding process.

16. A method of manufacturing a semiconductor device, including a multi-oxidation process for forming oxide films with different thicknesses on a substrate, said method comprising:
  executing an oxide film forming process for forming said oxide films on said substrate;
  executing a plurality of oxynitriding processes for forming a nitride layer in said oxide films after the oxide film forming process; and
  selectively etching a region of the oxide film, which is formed by a last oxide film forming process, between a last oxynitriding process and a succeeding oxide film forming process.

17. A semiconductor device having a substrate with a plurality of regions, comprising:
  oxide films formed in said regions and having different thicknesses; and
  nitride layers formed at vicinities of interfaces between said oxide films and said substrate,
  wherein said nitride layers comprise different amounts of nitrogen elements.

* * * * *